(12) United States Patent
Glaser et al.

(10) Patent No.: US 9,720,768 B2
(45) Date of Patent: Aug. 1, 2017

(54) SYSTEM AND METHOD FOR EARLY PACKET HEADER VERIFICATION

(71) Applicant: Nvidia Corporation, Santa Clara, CA (US)

(72) Inventors: Stephen D. Glaser, Santa Clara, CA (US); Eric Tyson, Santa Clara, CA (US); Mark Hummel, Santa Clara, CA (US); Michael Osborn, Santa Clara, CA (US); Jonathan Owen, Santa Clara, CA (US); Marvin Denman, Santa Clara, CA (US); Dennis Ma, Santa Clara, CA (US); Denis Foley, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 14/875,880

(22) Filed: Oct. 6, 2015

(65) Prior Publication Data
US 2017/0097867 A1   Apr. 6, 2017

(51) Int. Cl.
*H03M 13/00* (2006.01)
*G06F 11/10* (2006.01)
*H03M 13/09* (2006.01)

(52) U.S. Cl.
CPC ......... *G06F 11/1004* (2013.01); *H03M 13/09* (2013.01)

(58) Field of Classification Search
CPC .......................... G06F 11/1004; H03M 13/09
See application file for complete search history.

(56) References Cited

U.S. PATENT DOCUMENTS

| | | | | |
|---|---|---|---|---|
| 6,804,257 B1 * | 10/2004 | Benayoun | ............. | H04L 1/0061 370/471 |
| 2004/0153952 A1 * | 8/2004 | Sharma | ................. | H04L 1/0061 714/781 |
| 2013/0051385 A1 * | 2/2013 | Jayasimha | .............. | H04L 45/00 370/389 |
| 2015/0180507 A1 * | 6/2015 | Willey | ................ | H04L 12/4641 714/758 |

\* cited by examiner

*Primary Examiner* — Sam Rizk

(57) ABSTRACT

A receiver, transmitter and method for early packet header verification are provided. In one embodiment, the method includes: (1) receiving a payload flit of a preceding packet and a header flit of a current packet; and (2) using a Cyclic Redundancy Check (CRC) in the header flit to verify the payload flit of the preceding packet and the header flit of the current packet.

17 Claims, 3 Drawing Sheets

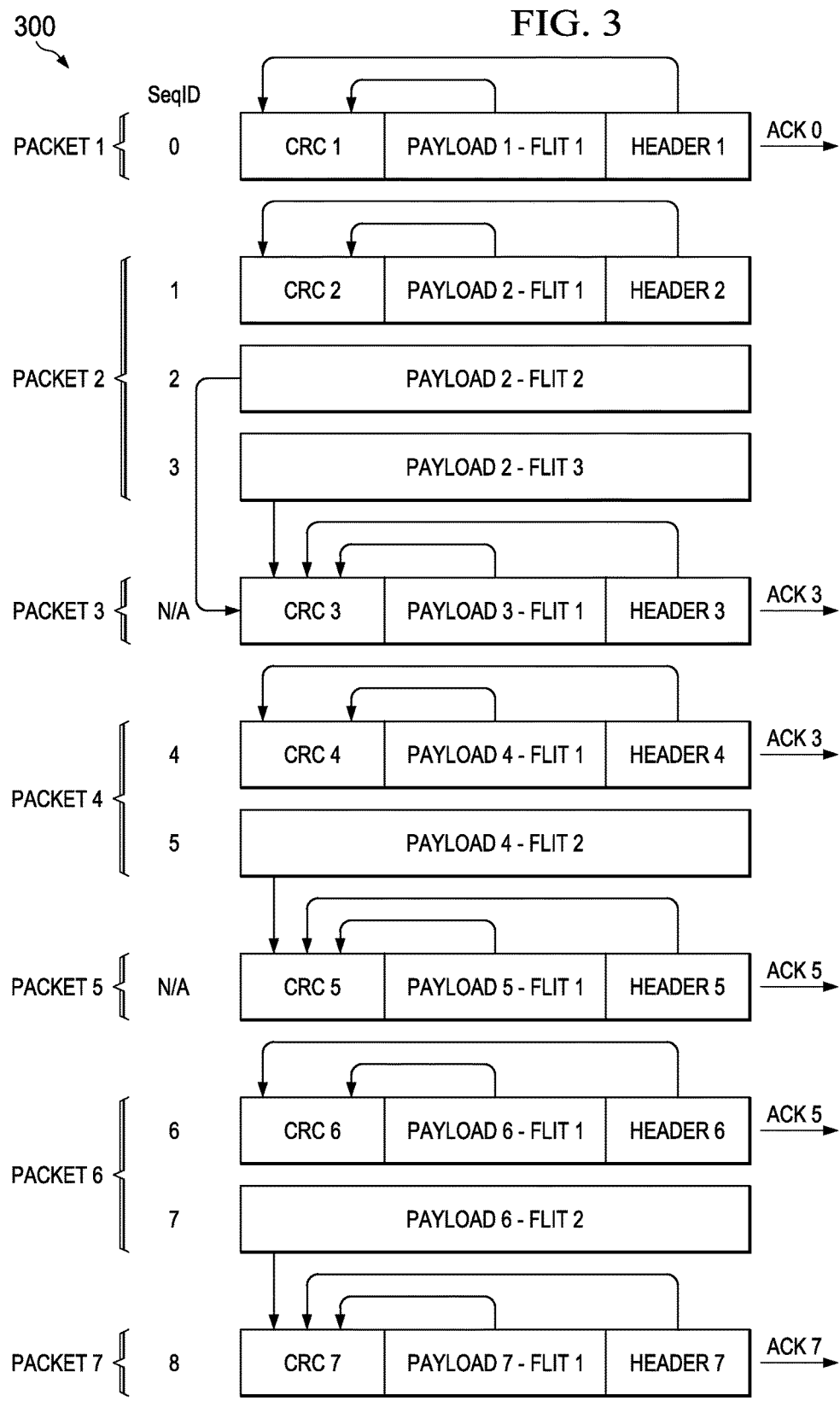

SYSTEM AND METHOD FOR EARLY PACKET HEADER VERIFICATION

TECHNICAL FIELD

This application is directed, in general, to a communication protocol between devices and, more specifically, to an error detection method.

BACKGROUND

Data sent across serial interfaces is grouped into packets. Typically, these packets contain a header and a payload. To detect errors (and perhaps repair them), a cyclic redundancy check (CRC) is calculated against an entire packet and added to the packet so a receiver can determine if the packet was corrupted in its transmission. Because the CRC is calculated using the entire packet (i.e. the header and the payload), it is usually added to the end of the packet. A CRC is an effective way to detect packet error and is in we use today.

SUMMARY

One aspect proves a method for early packet header verification. In one embodiment, the method includes: (1) receiving a payload flit of a preceding packet and a header flit of a current packet and (2) using a CRC in the header flit to verify the payload flit of the preceding packet and the header flit of the current packet. The preceding packet precedes the current packet.

Another aspect proves a transmitter for early packet header verification. In one embodiment, the transmitter includes: (1) a CRC encoder configured to calculate a CRC against a header flit of a current packet and a payload flit of a preceding packet and (2) a physical layer interface configured to transmit the preceding packet and the current packet. The preceding packet precedes the current packet.

In yet another aspect proves a receiver for early packet header verification. In one embodiment, the receiver includes: (1) a physical layer interface configured to receive a payload flit of a preceding packet and a header flit of a current packet and (2) a CRC decoder configured to verify the payload flit of the preceding packet and the header flit of the current packet using a CRC in the header flit. The preceding packet precedes the current packet.

BRIEF DESCRIPTION

Reference is now made to the following descriptions taken in conjunction with the accompanying drawings, in which:

FIG. 3 is a diagram of a stream of packets illustrating novel CRCs; and

DETAILED DESCRIPTION

Figure 1:
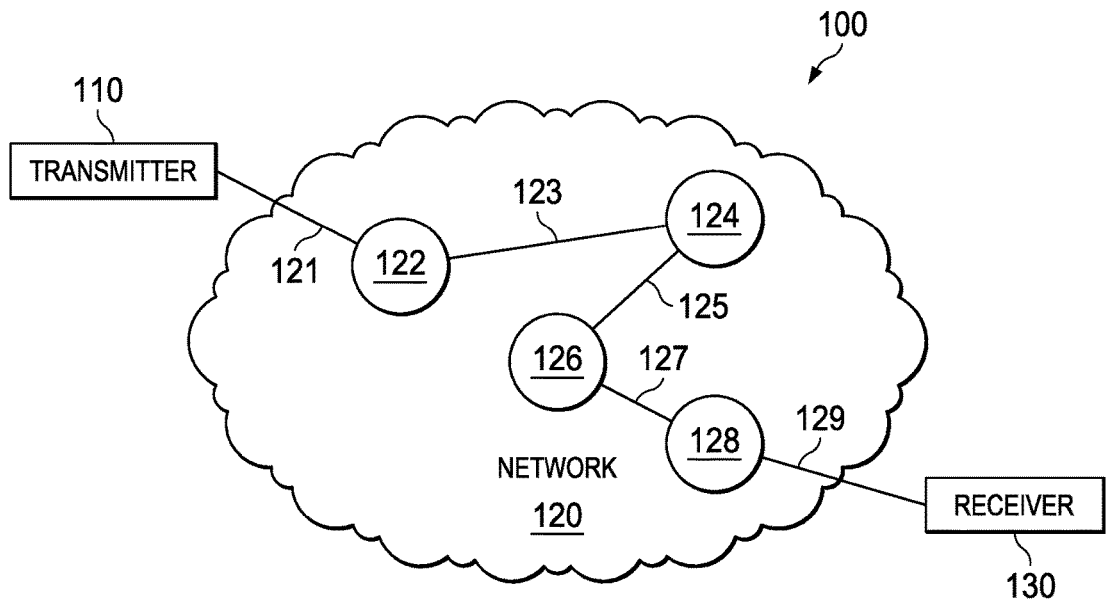
FIG. 1 is a block diagram of a network and a system that communicates through the network.

As stated above, a CRC for a given packet is usually appended to the packet (i.e. added to its end). This is an efficient technique for the transmitter, because the CRC is calculated against the entire packet, and the transmitter can start transmitting the packet while calculating the CRC. However, it is realized herein that this is not an efficient technique for the receiver.

More specifically, it is realized herein that placing a CRC at the end of a packet means that the receiver cannot begin to determine whether or to what extent a packet has been corrupted until the entire packet (including, of course, the CRC) is received. If the packet is corrupt (and the CRC is inadequate to correct its errors), the receiver requests retransmission, i.e. replay. Unfortunately, this delay manifests as a latency penalty, proportional to packet length. The latency penalty is particularly severe when the packet header is corrupt; the receiver must receive the entire packet before it is able to detect that the header has been corrupted. Adding to the severity is the fact that packet headers often contain the most important information in a packet. Thus, it is realized herein that determining whether or not a header is corrupt more quickly than currently possible would be particularly advantageous.

One approach to addressing this issue might be to dive the CRC into separate CRCs: one calculated against the header and another calculated against the payload. However, those skilled in the pertinent art know that, due to the convolutional nature of CRCs, two CRCs having a given combined length prove less protection than a single CRC of the same given length. Stated another way, the two separate CRCs would have to be longer to yield the same error protection as would the single, undivided CRC. This gives a rise to a regrettable tradeoff between error protection and packet overhead.

Introduced herein are various embodiments of a system and method for early packet header verification according to which a given packet in a stream contains a CRC calculated against both its header flit and the payload flit(s) of the packet preceding it in the stream. According to the various embodiments, the CRC is inserted in the packet within its header flit. Thus a receiver is proved with the CRC for the header of a packet that it has yet to finish receiving, which allows the receiver to verify the header and request retransmission, i.e. replay, at an earlier time than would otherwise be possible with the conventional CRC scheme described above.

Because the CRC is also calculated against the payload flit(s) of the preceding packet (which has already been received), the receiver can verify it as well. Finally, the strength inherent in a single, undivided CRC is preserved, because the CRC of the various embodiments disclosed herein is calculated against both a header flit and a payload flit(s), though not of the same packet. It should be apparent to those skilled in the pertinent art that the various embodiments disclosed herein prove CRCs that allow earlier evaluation of packet headers, but still protect payloads.

FIG. 1 is a block diagram of a network 120 and a system 100 that communicates through the network 120. The network 120 may be a wired network, a wireless network or a hybrid network having both wired and wireless networks. In one embodiment, the network 120 may be an intranet, wherein multiple interconnected devices may communicate with one another using a communication protocol.

The system 100 includes a transmitter 110 and a receiver 130. The transmitter 110 transmits a stream of packets to the receiver 130 using a communication protocol. Of the transmitted packets, those that are retransmittable, i.e. replayable, are called non-AN0 packets and those that are not retransmittable are called AN0 packets. Non-AN0 packets are assigned with sequence s and their arrivals are acknowledged by the receiver. AN0 packets are not assigned with sequence s and their arrivals are not acknowledged by the receiver. The transmitter 110 may be an end-user device such as a desktop or laptop personal computer, a tablet, a smartphone, or a smart television or a processing unit such as a CPU or GPU in such end-user devices.

In the illustrated embodiments, the transmitted packets are dived into multiple "flits," a unit of transfer in a communication protocol having a fixed amount, e.g., 128 bits, of data. In alternative embodiments, the flits may be of lengths other than 128 bits. A first flit of a packet is called a "header flit" and any subsequent flit(s), if any, are called "payload flits." In one embodiment, a header flit includes a header and initial payload of the packet, and a CRC that is calculated against the header and initial payload of the packet. In other embodiment, a CRC is also calculated against payload(s) in the payload flit(s) of the preceding packet. A header flit includes a field that specifies the number of remaining flits in the packet and an optional field that contains Late Meta Data (LMD) associated with the previous, replayable (non-AN0) packet's payload.

The receiver 130 receives the stream of packets from the transmitter 110. The receiver 130 may be an end-user device such as a desktop or laptop personal computer, a tablet, a smartphone, or a smart television or a processing unit such as a CPU or GPU in such end-user devices.

In the illustrated embodiment, the data channel in the network 120 includes multiple physical links 121, 123, 125, 127. 129 connected by multiple routers 122, 124, 126, 128. The physical links 121, 123, 125, 127, 129 may be of various media or types, including Ethernet, Wi-Fi, and cellular connections, such as Long Term Evolution (LTE). Packets passing through these links may use various communication protocols, including internet protocol such as Transmission Control Protocol (TCP) and User Datagram Protocol (UDP) or a proprietary communication protocol such as NVLink®, a service of NVIDIA Corporation of Santa Clara, Calif.

Figure 2A:
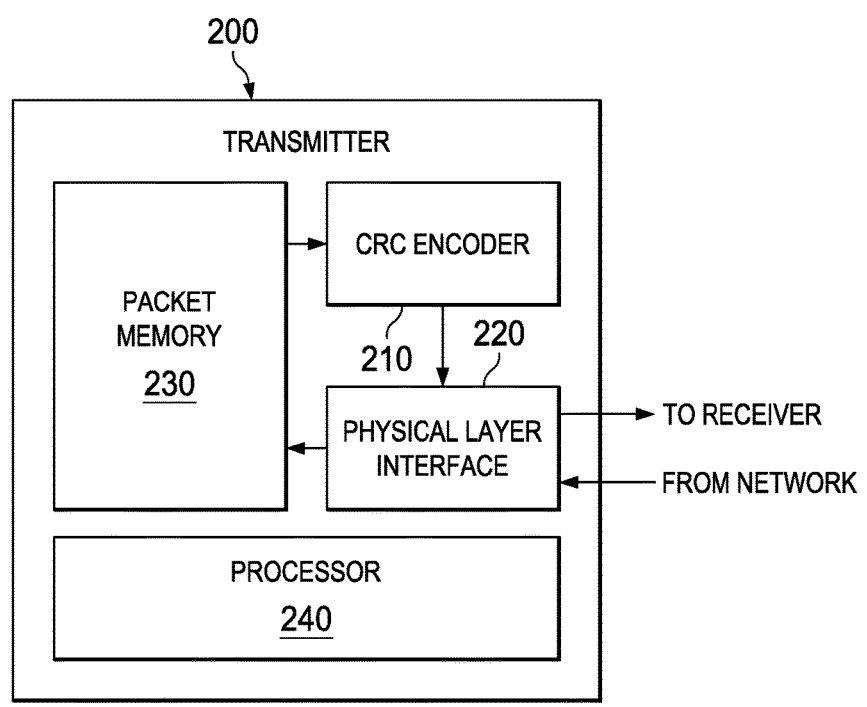
FIG. 2A is a block diagram of one embodiment of a transmitter for early packet header verification.
Figure 2B:
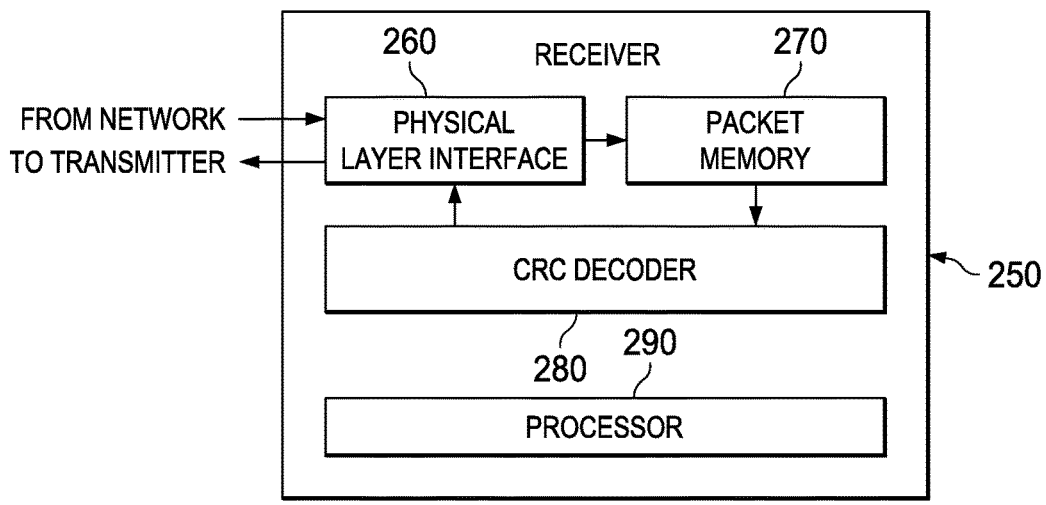
FIG. 2B is a block diagram of one embodiment of a receiver, coupled to the transmitter of FIG. 2A, for early packet header verification.

FIGS. 2A and 2B are block diagrams of embodiments of a transmitter 200 and receiver 250, coupled to one another, for early packet header verification. The transmitter 200 may be the transmitter 110 of FIG. 1, and the receiver 250 may be the receiver 130 of FIG. 1.

In one embodiment, the transmitter 200 and receiver 250 may be two interconnected devices using a communication protocol such as NVIDIA® NVLink. In such an embodiment, the interconnected devices may be located on different die within a multi-chip module or on different packages on a printed circuit board.

In FIG. 2A, the transmitter 200 includes a CRC encoder 210, a physical layer interface 220, a packet buffer 230, and a processor 240. The transmitter 200 is configured to transmit a stream of packets including a current packet and a preceding packet. In one embodiment, the preceding packet immediately precedes the current packet.

The CRC encoder 210 is configured to calculate a CRC against a header flit of the current packet and a payload flit(s) of the preceding packet. In the illustrated embodiment, the header of the current packet and the CRC are located in the header flit. As the CRC is located in the header flit and not in the payload flit(s), the header may be verified as soon as the header flit including the CRC is received. Accordingly, in one embodiment, the header of the current packet is verified using the CRC before the remainder, i.e. the payload flit(s), of the current packet is received.

In the illustrated embodiment, the physical layer interface 220 is configured to transmit the stream of packets including the preceding packet and the current packet to the receiver 250. The physical layer interface 220 is also configured to re-transmit some of the transmitted packets, i.e. replayable, non-AN0 packets. In one embodiment, a transmitted packet is retransmitted, i.e. replayed, when the physical layer interface 220 does not receive, within a certain time period, an acknowledgement that the transmitted packet has been successfully received at the receiver 250. A transmitted packet is "successfully received" when the packet is verified to contain no error.

The packet memory 230 is configured to store packets to be transmitted and recently transmitted packets that have not yet been confirmed to be received. In one embodiment, the recently transmitted, replayable (non-AN0) packets are stored in a replay buffer (not shown). In one embodiment, the packet memory 220 is in the form of a buffer. The packet memory 220 may be located in a network interface controller (NIC) or the processor 240.

The processor 240 is coupled to the physical layer interface 220. The processor 240 is configured to execute any function(s) of the CRC encoder 210 that is implemented as series of instructions stored in a memory (not shown).

In FIG. 2B, the receiver 250 includes a physical layer interface 260, packet memory 270, a CRC decoder 280, and a processor 290. The receiver 200 receives a stream of packets including a current packet and a preceding packet that immediately precedes the current packet.

In the illustrated embodiment, the physical layer interface 260 is configured to receive the stream of packets transmitted from the transmitter 200. The physical layer interface 260 is also configured to send an acknowledgement to the transmitter 200 that a replayable packet has been successfully received at the receiver 250. An acknowledgment may not be sent until a header of the following packet is received.

As discussed above, a packet is successfully received when the packet is verified to contain no error. In one embodiment, an acknowledgment for a packet is sent after a header flit of its subsequent packet is received.

The packet memory 270 is configured to store received packets for the verification process. In one embodiment, the packet memory 270 is in the form of a buffer. The packet memory 270 may be located in a Network Interface Controller ("NIC") or the processor 290.

The CRC decoder 280 is configured to verify the header flit of the current packet and the payload flit(s), if any, of the preceding packet using the CRC in the header flit of the current packet. In one embodiment, the header flit of the current packet may include LMD associated with the earlier payload of the preceding (replayable) packet. In such an embodiment, the verification process of the payload flit(s) of the preceding packet may be based on the LMD. As the CRC is located in the header flit of the current packet and not in the payload flit(s), if any, of the current packet, the header of the current packet may be verified as soon as the header flit of the current packet including the CRC is received. The verification result of the header flit of the current packet may be included in the following packets as LMD.

The processor 290 is coupled to the physical layer interface 260. The processor 290 is configured to execute any function(s) of the CRC decoder 280 that is implemented as a series of instructions stored in a memory (not shown).

FIG. 3 is a diagram of a stream 300 of packets illustrating novel CRCs. The illustrated packets may be communicated using a communication protocol such as NVIDIA® NVLink.

The illustrated stream 300 includes seven (7) packets bearing eleven (11) flits. In the illustrated embodiment, packets 1, 2, 4, 6 are replayable, non-AN0 packets that are used for data transfer. Non-AN0 packets is assigned with sequence IDs and acknowledged at the receiver. Non-AN0 packets may be multi-flit packets. In the illustrated embodiment, packets 3, 5, 7 are non-replayable, AN0 packets that are used for other purposes such as error recovery and power management. AN0 packets are single-flit packets that are not assigned with sequence IDs. As such, AN0 packets are not kept in the replay buffer in the transmitter and not acknowledged at the receiver.

The first packet (Packet 1) is a non-AN0 packet having a single, header flit (FLIT 1). The header flit includes the only payload (PAYLOAD 1-FLIT 1) and a header (HEADER 1) of the first packet, and a CRC (CRC1) that is calculated against the payload and header of the first packet. As the first packet does not have any packet before it in the stream, its header (HEADER 1) does not include LMD. It is noted herein that a replayable packet is not acknowledged until the header flit of its subsequent packet is received.

When the header flit of the first packet is received, its payload (PAYLOAD 1-FLIT 1) and the header (HEADER 1) are verified by CRC1. As there is no packet preceding the first packet, no acknowledgment is sent. The result of the verification is included in the next header flit in the stream as LMD of the first packet.

The second packet (Packet 2) is a multi-flit, non-AN0 packet. The packet includes three flits, a header flit (FLIT 1) and two payload flits (FLIT 2 and FLIT 3). The header flit includes the first payload (PAYLOAD 2-FLIT 1) and a header (HEADER 2) of the second packet and a CRC (CRC2) that is calculated against the first payload and header of the second packet. The payload flits include the second and third payloads, Payload 2-FLIT 2 and Payload 2-FLIT 3, of the second packet, respectively.

When the header flit of the second packet is received, the header flit, i.e. the first payload (PAYLOAD 2-FLIT 1) and the header (HEADER 2), of the second packet are verified by CRC2. As the verification does not involve the payload of the previous, first packet, the receiver may determine whether the first packet is a good, i.e. successfully received, replayable packet before the verification is complete based on the LMD of the first packet. In the illustrated embodiment, the first packet is verified as a good, replayable packet, and an acknowledgment for the first packet is sent. The acknowledgement identifies the first packet by its last flit, the sequence ID 0. The verification result for the header flit of the second packet is included in the next header flit in the stream as LMD of the second packet.

The third packet (Packet 3) is an AN0 packet. The packet includes one flit, a header flit (FLIT 1). The header flit includes a payload (PAYLOAD 3-FLIT 1) and a header (HEADER 3) of the third packet and a CRC (CRC3) that is calculated against the second and third payloads (PAYLOAD 2-FLIT 2 and PAYLOAD 2-FLIT 3) of the preceding, second packet and the payload and header of the third packet.

When the header flit of the third packet is received, the second and third payloads (PAYLOAD 2-FLIT 2 and PAYLOAD 2-FLIT 3) of the previous, second packet and the payload (PAYLOAD 3-FLIT 1) and the header (HEADER 3) of the third packet are verified by CRC3. As the verification involves the payload of the preceding, second packet, the receiver may not acknowledge whether the second packet is a good, replayable packet until the verification is complete. In the illustrated embodiment, the second packet is acknowledged as a good, replayable packet based on the verification and the LMD of the second packet. The acknowledgement identifies the second packet by the sequence ID of its last flit, the sequence ID 3. As the third packet is a non-replayable, AN0 packet, the verification result for the header flit of the third packet is not included in the next header flit in the stream as LMD.

The fourth packet (Packet 4) is a non-AN0 packet having two flits, a header flit (FLIT 1) and a payload flit (FLIT 2). The header flit includes the first payload (PAYLOAD 4-FLIT 1) and a header (HEADER 4) of the fourth packet and a CRC (CRC4) that is calculated against the first payload and header of the fourth packet. The payload flit includes the second payload (PAYLOAD 4-FLIT 2) of the fourth packet.

When the header flit of the fourth packet is received, the header flit, i.e. first payload (PAYLOAD 4-FLIT 1) and the header (HEADER 4), of the fourth packet are verified by CRC4. As the verification does not involve the payload or LMD of the preceding, third packet, the receiver may acknowledge whether the third packet is a good, replayable packet before the verification is complete. In the illustrated embodiment, no acknowledgment for the third packet is sent because the third packet is a non-replayable, AN0 packet. Instead, an acknowledgment for the second packet (the previous good, replayable packet) is sent again. The acknowledgement identifies the second packet by its last flit, the sequence ID 3. The verification result for the header flit of the fourth packet is included in the next header flit of the stream as the LMD of the fourth packet.

The fifth packet (Packet 5) is an AN0 packet. The packet includes one flit, a header flit (FLIT 1). The header flit includes a payload (PAYLOAD 5-FLIT 1) and a header (HEADER 5) of the fifth packet and a CRC (CRC5) that is calculated against the second payload (PAYLOAD 4-FLIT 2) of the preceding, fourth packet and the payload and header of the fifth packet.

When the header flit of the fifth packet is received, the second payload (PAYLOAD 4-FLIT 2) of the preceding, fourth packet and the first payload (PAYLOAD 5-FLIT 1) and header (HEADER 5) of the fifth packet are verified by CRC 5. As the verification involves the payload of the preceding, fourth packet, the receiver may not acknowledge whether the fourth packet is a good, replayable packet until the verification is complete. In the illustrated embodiment, the fourth packet is acknowledged as a good, replayable packet based on the verification and the LMD of the fourth packet. The acknowledgement identifies the fourth packet by the sequence ID of its last flit, the sequence ID 5. As the fifth packet is a non-replayable, AN0 packet, the verification result for the header flit of the fifth packet is not included in the next header flit in the stream as LMD.

The sixth packet (Packet 6) is a non-AN0 packet that includes two flits, a header flit (FLIT 1) and a payload flit (FLIT 2). The header flit includes a first payload (PAYLOAD 6-FLIT 1) and a header (HEADER 6) of the sixth packet and a CRC (CRC6) that is calculated against the first payload and header of the sixth packet. The payload flit of the sixth packet includes the second payload (Payload 6-FLIT 2) of the sixth packet.

When the header flit of the sixth packet is received, the first payload (PAYLOAD 6-FLIT 1) and the header (HEADER 6) of the sixth packet are verified by CRC 6. As the verification does not involve the payload or LMD of the previous, the receiver may acknowledge whether the previous, fifth packet is a good, replayable packet before the verification is complete. In the illustrated embodiment, no acknowledgment for the fifth packet is sent because the fifth packet is a non-replayable, AN0 packet. Instead, an acknowledgment for the fourth packet (the last good, replayable packet) is sent again. The acknowledgement identifies the fourth packet by its last flit, the sequence ID 5. The verification result for the header flit of the sixth packet may be included in the next header flit in the stream as LMD of the sixth packet.

The seventh packet (Packet 7) is an AN0 packet that includes one flit, a header flit (FLIT 1). The header flit includes a payload (PAYLOAD 7-FLIT 1) and a header (HEADER 7) of the seventh packet and a CRC (CRC7) that is calculated against the second payload (PAYLOAD 6-FLIT 2) of the preceding, sixth packet and the payload and header of the seventh packet.

When the header flit of the seventh packet is received, the second payload (PAYLOAD 6-FLIT 2) of the preceding, sixth packet and the payload (PAYLOAD 7-FLIT 1) and the header (HEADER 7) of the seventh packet are verified by CRC 7. As the verification involves the payload of the sixth packet, the receiver may not acknowledge whether the previous, sixth packet is a good, replayable packet until the verification is complete. In the illustrated embodiment, the sixth packet is acknowledged as a good, replayable packet based on the verification and the LMD of the sixth packet. The acknowledgement identifies the sixth packet by the sequence ID of its last flit, the sequence ID 7. As the seventh packet is a non-replayable, AN0 packet, the verification result for the header flit of the seventh packet is not included in the next header flit in the stream as LMD.

In the illustrated embodiment, the seventh packet is the last packet in the stream. A stream may be ended with the seventh packet because as an AN0 packet, the seventh packet does not require a following packet for the acknowledgment or LMD.

Figure 4:
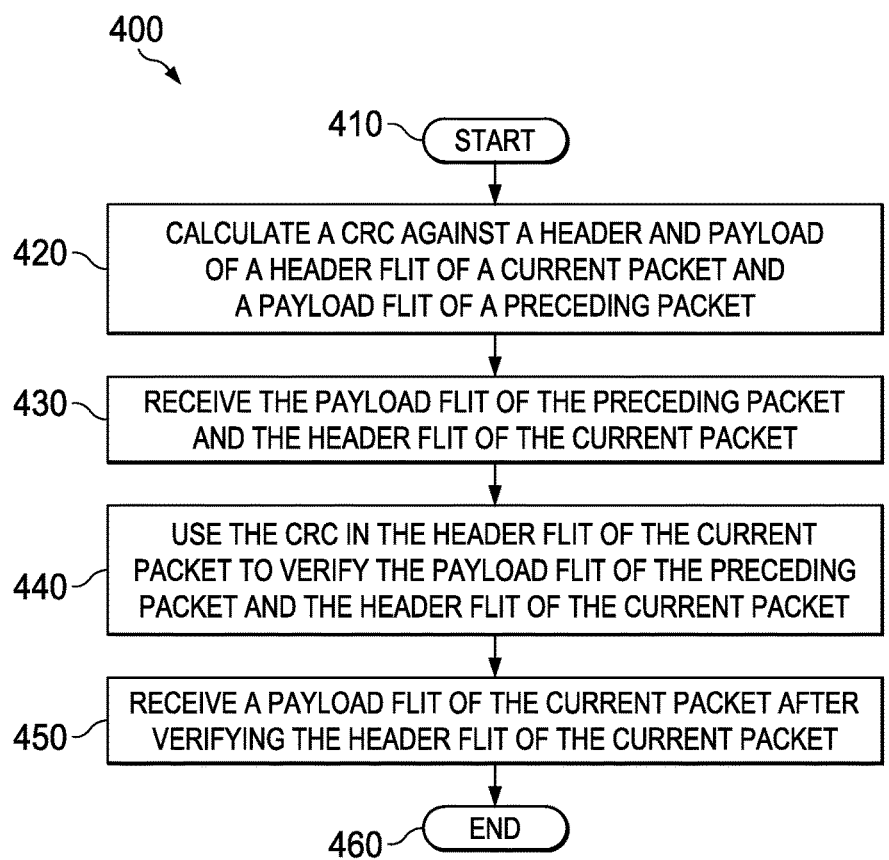
FIG. 4 is a flow diagram of one embodiment of a method of early packet header verification.

FIG. 4 is a flow diagram of one embodiment of a method of early packet header verification. In one embodiment, the illustrated method 400 is implemented in a network where packets are streamed over a data channel having multiple physical links of multiple types over multiple platforms. In another embodiment, the illustrated method 400 is implemented in an intranet where devices, e.g., between a CPU and GPU or among GPUs, are interconnected using a communication protocol such as NVIDIA® NVLink. In such an embodiment, the interconnected devices may be on different dies within a multi-chip module or on different packages on a printed circuit board.

The method begins in a start step 410. In a step 420, a CRC is calculated against a header flit, i.e. a header and payload, of a current packet and a payload flit(s), i.e. a payload(s), of a preceding packet in a stream. The payload flit(s) of the preceding packet immediately precedes the header flit of the current packet. In the illustrated embodiment, the header of the current packet and the CRC are located in the header flit of the current packet.

In a step 430, the payload flit(s) of the preceding packet and the header flit of the current packet are received at the receiver. Using the CRC in the header flit of the current packet, the payload flit(s) of the preceding packet and the header flit of the current packet are verified in a step 440. In one embodiment, the header flit (including the header) of the current packet is verified before the payload flit(s) of the current packet, if any, is received.

A packet is good or successfully received when the received packet is verified to contain no error. Once the preceding packet is verified (and the header flit of the current packet is received), an acknowledgement that the preceding packet is successfully received at the receiver is sent to the transmitter. In one embodiment, an acknowledgment that the current packet has been successfully received is sent after a header flit of its subsequent packet is verified. In other embodiment, an acknowledgment that the current packet has been successfully received is sent after a header flit of its subsequent packet is received.

When a packet is not successfully received, no acknowledgment is sent to the transmitter. When the transmitter does not receive the acknowledgment for a transmitted packet for a certain period of time, the transmitter automatically retransmit, i.e. replay, the transmitted packet to the receiver. In the illustrated embodiment, both the preceding and current packets are replayable, non-AN0 packets.

In step 450, a payload flit of the current packet, if any, is received. Similar to the payload flit of the preceding packet, the payload flit of the current packet may be verified by a CRC in a header flit of the next packet in the stream. The method ends in an end step 460.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

The above-described apparatuses and methods or at least a portion thereof may be embodied in or performed by various, such as conventional, digital data processors or computers, wherein the computers are programmed or store executable programs of sequences of software instructions to perform one or more of the steps of the methods, e.g., steps of the method of FIG. 4. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, e.g., one or more of the steps of the method of FIG. 4, or functions of the apparatuses described herein, e.g., a receiver and a transmitter.

Certain embodiments of the invention further relate to computer storage products with a non-transitory computer-readable medium that have program code thereon for performing various computer-implemented operations that embody the apparatuses, the systems or carry out the steps of the methods set forth herein. For example, a CRC encoder or a CRC decoder may be implemented as such a computer storage product. Non-transitory medium used herein refers to all computer-readable media except for transitory, propagating signals. Examples of non-transitory computer-readable medium include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which this application relates will appreciate that other and further additions, deletions, substitutions and modifications may be made to the described embodiments.

What is claimed is:

1. A method for an early packet header verification, comprising:
   receiving a payload flit of a preceding packet and a header flit of a current packet; and
   using a Cyclic Redundancy Check (CRC) in said header flit to verify said payload flit of said preceding packet and said header flit of said current packet, wherein said CRC is a sole CRC in said current packet.

2. The method as recited in claim 1, further comprising calculating said CRC against a header and a payload of said header flit of said current packet and a payload of said payload flit of said preceding packet.

3. The method as recited in claim 1, further comprising receiving a payload flit of said current packet after verifying said header flit of said current packet.

4. The method as recited in claim 1, wherein said payload flit of said preceding packet immediately precedes said header flit of said current packet.

5. The method as recited in claim 1, further comprising sending an acknowledgment that said preceding packet has been successfully received.

6. The method as recited in claim 1, further comprising sending an acknowledgment that said current packet has been successfully received.

7. A transmitter for an early packet header verification, the transmitter comprising:
   a CRC encoder configured to calculate a CRC against a header flit of a current packet and
   a payload flit of a preceding packet; and
   a physical layer interface configured to transmit said preceding packet and said current packet, wherein said CRC is a sole CRC in said current packet.

8. The transmitter as recited in claim 7, wherein said header flit of said current packet is verified before a payload flit of said current packet is received.

9. The transmitter as recited in claim 7, wherein said CRC is calculated against a header and a payload of said header flit of said current packet and a payload of said payload flit of said preceding packet.

10. The transmitter as recited in claim 7, wherein said payload flit of said preceding packet immediately precedes said header flit of said current packet.

11. The transmitter as recited in claim 7, wherein said physical layer interface is further configured to retransmit said preceding packet based on a determination that said preceding packet has not been successfully received.

12. A receiver for an early packet header verification, the receiver comprising:
   a physical layer interface configured to receive a payload flit of a preceding packet and a header flit of a current packet; and
   a CRC decoder configured to verify said payload flit of said preceding packet and said header flit of said current packet using a CRC in said header flit, wherein said CRC is a sole CRC in said current packet.

13. The receiver as recited in claim 12, wherein said CRC is calculated against a header and a payload of said header flit of said current packet and a payload of said payload flit of said preceding packet.

14. The receiver as recited in claim 12, wherein said header flit of said current packet is verified before a payload flit of said current packet is received.

15. The receiver as recited in claim 12, wherein said payload flit of said preceding packet immediately precedes said header flit of said current packet.

16. The receiver as recited in claim 12, wherein said physical layer interface is further configured to send an acknowledgement that said current packet has been successfully received.

17. The receiver as recited in claim 12, wherein said physical layer interface is further configured to send an acknowledgement that said preceding packet has been successfully received.

* * * * *

UNITED STATES PATENT AND TRADEMARK OFFICE
CERTIFICATE OF CORRECTION

PATENT NO. : 9,720,768 B2
APPLICATION NO. : 14/875880
DATED : August 1, 2017
INVENTOR(S) : Stephen D. Glaser et al.

It is certified that error appears in the above-identified patent and that said Letters Patent is hereby corrected as shown below:

In the Specification

In Column 1, Line 19, after "is in" delete "we" and insert --wide--

In Column 1, Line 24, after "aspect" delete "proves" and insert --provides--

In Column 1, Line 31, after "aspect" delete "proves" and insert --provides--

In Column 1, Line 38, after "aspect" delete "proves" and insert --provides--

In Column 2, Line 22, after "to" delete "dive" and insert --divide--

In Column 2, Line 27, after "length" delete "prove" and insert --provide--

In Column 2, Line 39, after "is" delete "proved" and insert --provided--

In Column 2, Line 53, after "herein" delete "prove" and insert --provide--

In Column 3, Line 1, after "sequence" delete "s" and insert --IDs--

In Column 3, Line 3, after "sequence" delete "s" and insert --IDs--

In Column 3, Line 9, after "are" delete "dived" and insert --divided--

Signed and Sealed this
Fifth Day of December, 2017

Joseph Matal
*Performing the Functions and Duties of the*
*Under Secretary of Commerce for Intellectual Property and*
*Director of the United States Patent and Trademark Office*